(12) United States Patent
Gose et al.

(10) Patent No.: US 7,202,711 B2
(45) Date of Patent: Apr. 10, 2007

(54) TECHNIQUE FOR DETERMINING A LOAD CURRENT

(75) Inventors: Mark W. Gose, Kokomo, IN (US); Douglas B. Osborn, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 37 days.

(21) Appl. No.: 11/220,767

(22) Filed: Sep. 7, 2005

(65) Prior Publication Data
US 2007/0052454 A1    Mar. 8, 2007

(51) Int. Cl.
*H03B 1/00*    (2006.01)
(52) U.S. Cl. ..................... 327/108; 327/404; 323/316
(58) Field of Classification Search ............... 327/108, 327/110, 72, 73, 403, 404, 427, 434, 538; 323/312–316; 307/571, 584
See application file for complete search history.

(56) References Cited

U.S. PATENT DOCUMENTS

| 4,553,084 | A | * | 11/1985 | Wrathall | 323/316 |
| 4,890,009 | A | * | 12/1989 | Miyazaki et al. | 327/108 |
| 5,369,308 | A | * | 11/1994 | Schoofs et al. | 327/427 |
| 5,422,593 | A | * | 6/1995 | Fujihira | 327/561 |
| 5,796,278 | A | * | 8/1998 | Osborn et al. | 327/108 |

* cited by examiner

*Primary Examiner*—Rajnikant B. Patel
(74) *Attorney, Agent, or Firm*—Jimmy L. Funke

(57) ABSTRACT

An integrated driver with improved load current sense capability includes a first transistor, a first amplifier, a second transistor, a third transistor, a second amplifier and a fourth transistor. The integrated driver allows for significantly better fault handling capability, provides accurate thermal and current sensing capability and reduces I/O pin count over prior designs.

20 Claims, 3 Drawing Sheets

TECHNIQUE FOR DETERMINING A LOAD CURRENT

TECHNICAL FIELD

The present invention is generally directed to a technique for determining a current and, more specifically, to a technique for determining a load current.

BACKGROUND OF THE INVENTION

In various applications, it is desirable to be able to precisely determine the amount of current that is flowing through a load. For example, in motor vehicles, it is frequently desirable to determine a load current that is flowing through an oxygen sensor heater, as an associated oxygen sensor needs to be maintained at a desired temperature in order to optimally perform. Typically, a resistance value of the heater may be determined from a battery voltage level and a current level flowing through the heater. The temperature of the heater can then be determined by utilizing the resistance value and a known temperature coefficient for the heater. The temperature of the heater is then controlled, typically by pulse width modulating a switch or driver to adjust an average current and power of the heater.

With reference to FIG. 1, a system 100 that includes a microcontroller 10 has implemented a discrete sense resistor R1 to measure a current drawn by a heater (load) H. As is shown, the resistor R1 is coupled between a source of a field-effect transistor (FET) M1 and ground and a drain of the FET M1 is coupled to a low-side of the load H, whose high-side is coupled to a positive terminal of battery VBAT. The voltage signal across the resistor R1 is differentially coupled to an amplifier AV1, via a circuit network that includes resistors R2 and R3 and capacitor C1. The amplifier AV1 amplifies the voltage dropped across the resistor R1 to a range that can be accurately sampled by an analog-to-digital converter (ADC) located within the microcontroller 10.

An output of the amplifier AV1 provides a voltage that is measured by the ADC. The microcontroller 10 provides a pulse width modulated (PWM) signal to gate drive circuit 12 responsive to the voltage signal provided by the amplifier AV1. The gate drive circuit 12 provides a control signal to a gate of the FET M1 responsive to the PWM signal. One drawback of this design is that the requirements on the resistor R1 are fairly stringent, due to the high currents involved, when driving an oxygen sensor heater. For example, the resistor R1 is typically designed to handle currents between about six to ten Amperes. In order to meet power and overall voltage drop requirements, the value of the resistor R1 has typically been selected to have a relatively small value, e.g., 25 milliOhms. In such an application, the absolute value of the resistor R1 must generally be tightly controlled, which, in turn, causes the resistor R1 to be relatively expensive.

Another drawback with the above-described design is that a relatively large number of input/output (I/O) pins are required to interface the discrete devices. This tends to increase the system circuit board size and complexity, which also results in additional cost. Furthermore, using the above-described approach, a temperature of the discrete FET M1 cannot be readily sensed, as it is not integrated and, thus, complete fault protection of the discrete FET M1 cannot be achieved.

What is needed is an integrated driver for a heater that can be readily integrated, allows for improved fault handling capability and that provides relatively accurate thermal and current sensing capability. It would also be desirable if the integrated driver reduced I/O pin count over prior designs.

SUMMARY OF THE INVENTION

One embodiment of the present invention is directed to an integrated driver that includes a first transistor, a first amplifier, a second transistor, a third transistor, a second amplifier and a fourth transistor. The first transistor includes a first terminal, a second terminal and a control terminal, with the first terminal of the first transistor coupled to one side of a load, e.g., an oxygen sensor heater. The first amplifier includes a first input, a second input and an output, with the first input of the first amplifier coupled to the first terminal of the first transistor. The second transistor includes a first terminal, a second terminal and a control terminal. The control terminal of the second transistor is coupled to the output of the first amplifier. The first terminal of the second transistor is coupled to one side of a power source, via a first impedance.

The third transistor includes a first terminal, a second terminal and a control terminal, with the first terminal of the third transistor coupled to the second terminal of the second transistor and the second input of the first amplifier. The control terminals of the first and third transistors are coupled together and the first and third transistors conduct responsive to a control signal provided on the control terminals of the first and third transistors. The second amplifier includes a first input, a second input and an output, with the first input of the second amplifier being coupled to the first terminal of the second transistor.

The fourth transistor includes a first terminal, a second terminal and a control terminal, with the output of the second amplifier being coupled to the control terminal of the fourth transistor and the second input of the second amplifier being coupled to the second terminal of the fourth transistor. The second terminal of the fourth transistor is also coupled to one side of the power source, via a second impedance, and the first terminal of the fourth transistor provides an output current that is indicative of a load current through the load.

According to one aspect of the present invention, the load is an oxygen sensor heater. According to a different aspect of the present invention, an impedance of the third transistor is about five-hundred times an impedance of the first transistor. According to a different aspect of the present invention, the first transistor is a double-diffused metal-oxide semiconductor (DMOS) driver. According to this aspect of the present invention, the DMOS driver may have an impedance of about fifty milliOhms. According to another embodiment of the present invention, the first transistor has an on-impedance of about fifty milliOhms and the third transistor has an on-impedance of about twenty-five Ohms. According to a different aspect of the present invention, an impedance of the second impedance is about ten times an impedance of the first impedance.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to various embodiments of the present invention, an integrated driver is disclosed that may provide accurate thermal and current sensing capabilities. The integrated driver provides a reduced I/O pin count over prior designs and allows for improved fault handling capability. As used herein, the term "transistor" broadly includes field-effect transistors (FETs) and bipolar junction transistors (BJTs), among other transistors. For simplicity, the discussion herein is primarily directed to FETs.

Figure 1:
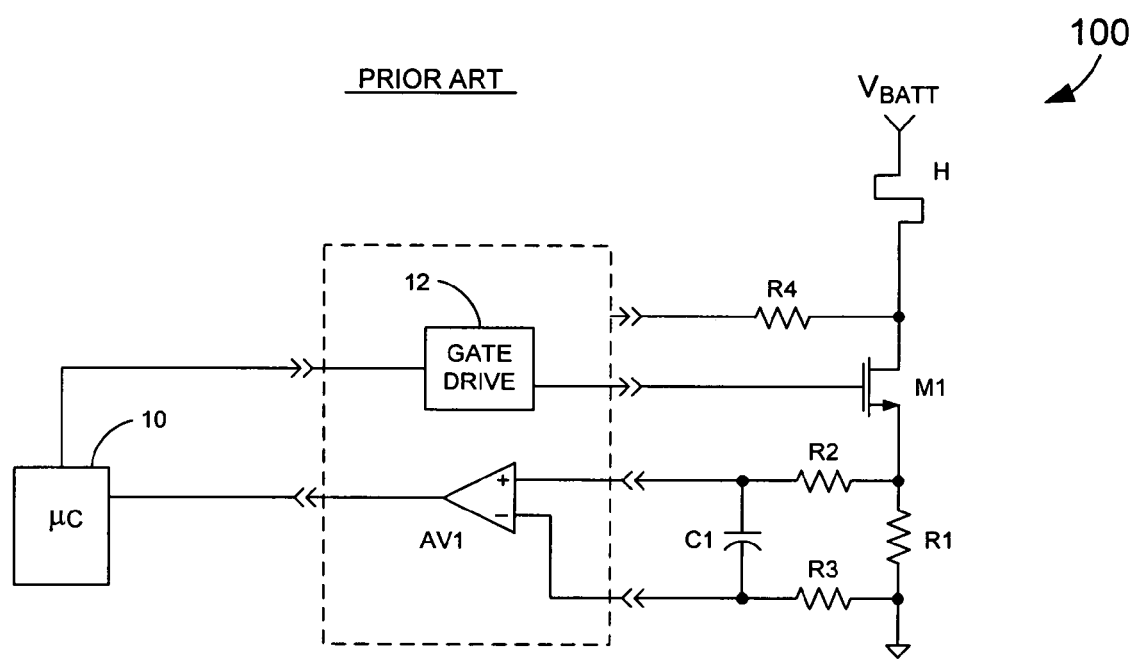
FIG. 1 depicts a circuit for driving a load and measuring a load current, according to the prior art.
Figure 2:
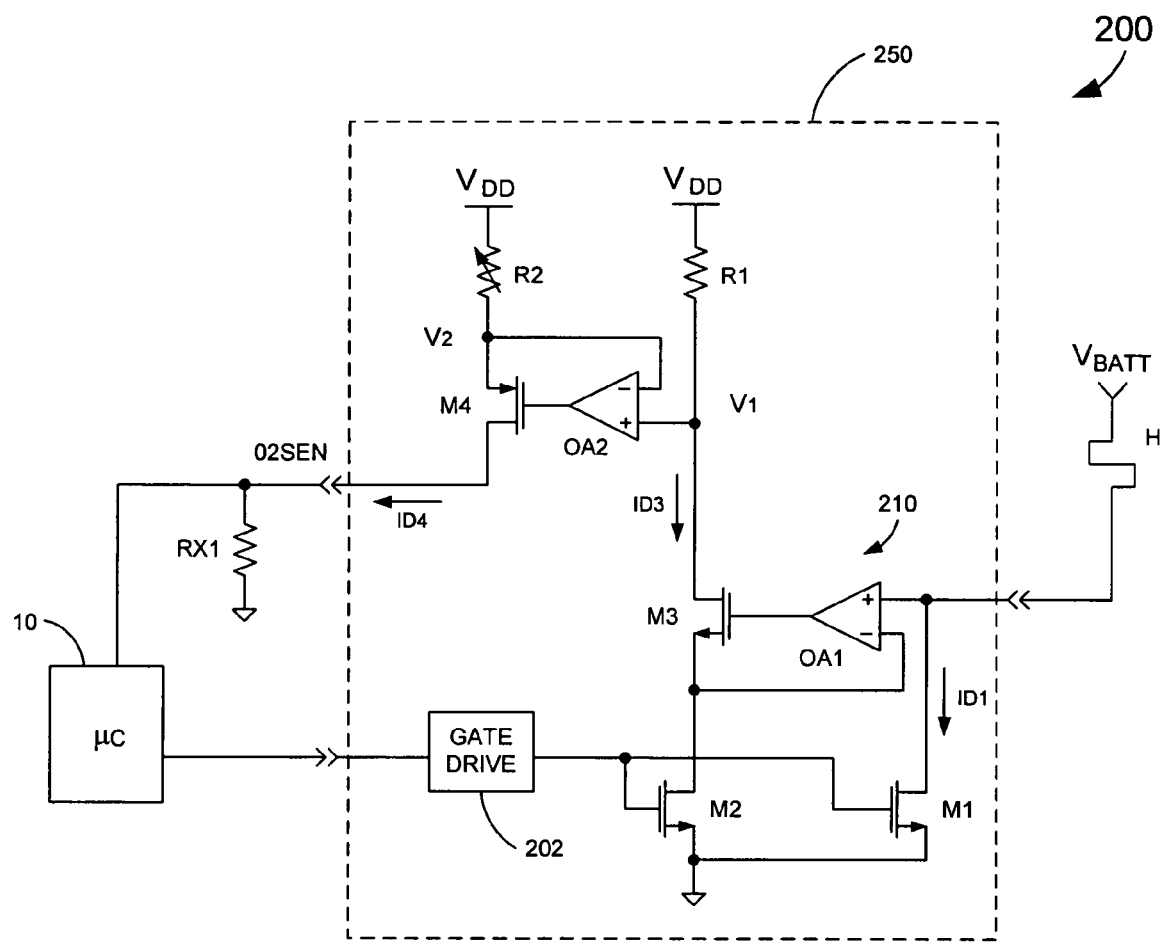
FIG. 2 depicts an integrated driver with improved load current and sense capability, according to the present invention.

With reference to FIG. 2, a system 200, configured according to one embodiment of the present invention, includes an integrated driver 250, which is coupled to a microcontroller 10, an external resistor RX1 and an oxygen sensor heater H. The microcontroller 10 provides a pulse width modulated (PWM) control signal to the driver 250 to control a temperature of the heater H. As is shown, the integrated driver 250 includes a transistor M1, e.g., a double-diffused metal-oxide semiconductor (DMOS) driver, whose control terminal (gate) receives a control signal from gate drive circuit 202. An input of the gate drive circuit 202 is coupled to an output of the microcontroller 10. The output of the gate drive circuit 202 is also coupled to a control terminal (gate) of a transistor M2, e.g., a DMOS driver, whose second terminal (source) is coupled to ground.

A first terminal (drain) of the transistor M1 is coupled to a low side of the load H and a second terminal (source) of the transistor M1 is coupled to ground. The drain of the transistor M1 is also coupled to a non-inverting input of an operational amplifier OA1. An output of the amplifier OA1 is coupled to a control terminal (gate) of a transistor M3, e.g., a DMOS driver. A second terminal (source) of the transistor M3 is coupled to a first terminal (drain) of the transistor M2 and to an inverting input of the amplifier OA1. As such, a voltage developed at the drain of the transistor M1 is provided at the drain of the transistor M2. One side of a resistor R1 is coupled to a positive power supply VDD and a second side of the resistor R1 is coupled to a first terminal (drain) of the transistor M3. The drain of the transistor M3 is also coupled to a non-inverting input of an operational amplifier OA2.

An output of the operational amplifier OA2 is coupled to a control terminal (gate) of a transistor M4, e.g., a P-channel DMOS driver. A second terminal (source) of the transistor M4 is coupled to the power supply VDD, via a variable resistor R2. An inverting input of the operational amplifier OA2 is also coupled to the second terminal of the transistor M4. A first terminal (drain) of the transistor M4 is coupled off-chip to the external resistor RX1, which is utilized to convert current ID4 (conducted by the transistor M4) into a voltage, which is then coupled to an analog-to-digital converter (ADC) input of the microcontroller 10. Accordingly, the microcontroller 10 can monitor the voltage across the resistor RX1 to determine a temperature of the heater H and, thus, control the gate drive circuit 202 to achieve a desired temperature for the heater H. Assuming that the transistor M1 has an impedance of about fifty milliOhms, the transistor M2 may, for example, be selected to have an impedance of about twenty-five Ohms, which is five-hundred times greater than the impedance of the transistor M1. That is, the transistor M2 may be selected to be about five-hundred times smaller in area than the size of the transistor M1.

As mentioned above, the amplifier OA1 is utilized to force the drain voltage of the transistors M1 and M2 to be substantially the same using the transistor M3. As the gates of the transistors M1 and M2 are common and the sources of transistors M1 and M2 are tied to ground, the transistors M1 and M2 have the same gate-to-source voltage and the same drain-to-source voltage. As such, a current ID3, conducted by the transistor M3, is one-five-hundredths of a load current ID1, conducted by transistor M1. The current ID3 feeds into resistor R1 to setup a voltage V1 at the non-inverting input of the amplifier OA2. The amplifier OA2 is utilized to cause voltage V2 to equal the voltage V1 through the transistor M4. The current ID4 carried by the transistor M4 represents one-five-thousandths of the load current ID1, when the value of the resistor R2 is selected to be ten times larger than the value of the resistor R1.

It should be appreciated that the value of the resistors R1 and R2 may be of the same implant type. The resistor R2 may be made adjustable utilizing, for example, a fusible link trim network, in order to trim out second order effects, such as mismatches between the transistors M1 and M2 and the resistors R1 and R2. As is shown, the current ID4 is output from the driver 250 on a pin labeled O2SEN. As noted above, the resistor RX1, which may be a precision resistor, is utilized to convert the output current ID4 into a voltage that is in the range required by the ADC of the microcontroller 10. For example, the value of the resistor RX1 may be selected to be about 3.48 kOhms. In the case described above, the voltage on the O2SEN pin is related to the load current ID1 by the following equation.

$$VO2SEN = ID1*(3480/(500*10)) = ID1*0.696$$

It should be appreciated that the design of FIG. 2 eliminates the need for expensive discrete resistors and eliminates the load current sense resistor from the load current path, which allows the transistor M1 to have a higher on-resistance than discrete drivers utilized in the prior art approach, while still meeting the same total on-resistance of the system. This allows the up-integrated transistor M1 to have a smaller area, thus, resulting in cost savings. Another advantage of an integrated driver, constructed according to the present invention, is that the O2SEN pin can be shared between multiple outputs. In this design, two or more O2 sensor heater driver circuits may be up-integrated onto the same IC. In this embodiment, both circuits provide output current on the same O2SEN pin under digital control such that both outputs are not providing a current feedback signal simultaneously.

It should be appreciated that this feature further reduces the I/O complexity of the integrated driver. Thus, following this approach, the number of I/O pins is greatly reduced. For example, in a two-channel implementation, the number of pins goes from twelve pins in the prior approach to four pins, which reduces board size and complexity, as well as improves the reliability of the system. Finally, up-integrating the O2SEN heater driver allows for significantly better fault handling capability, with accurate thermal and current sensing capability for the DMOS driver.

Figure 3:
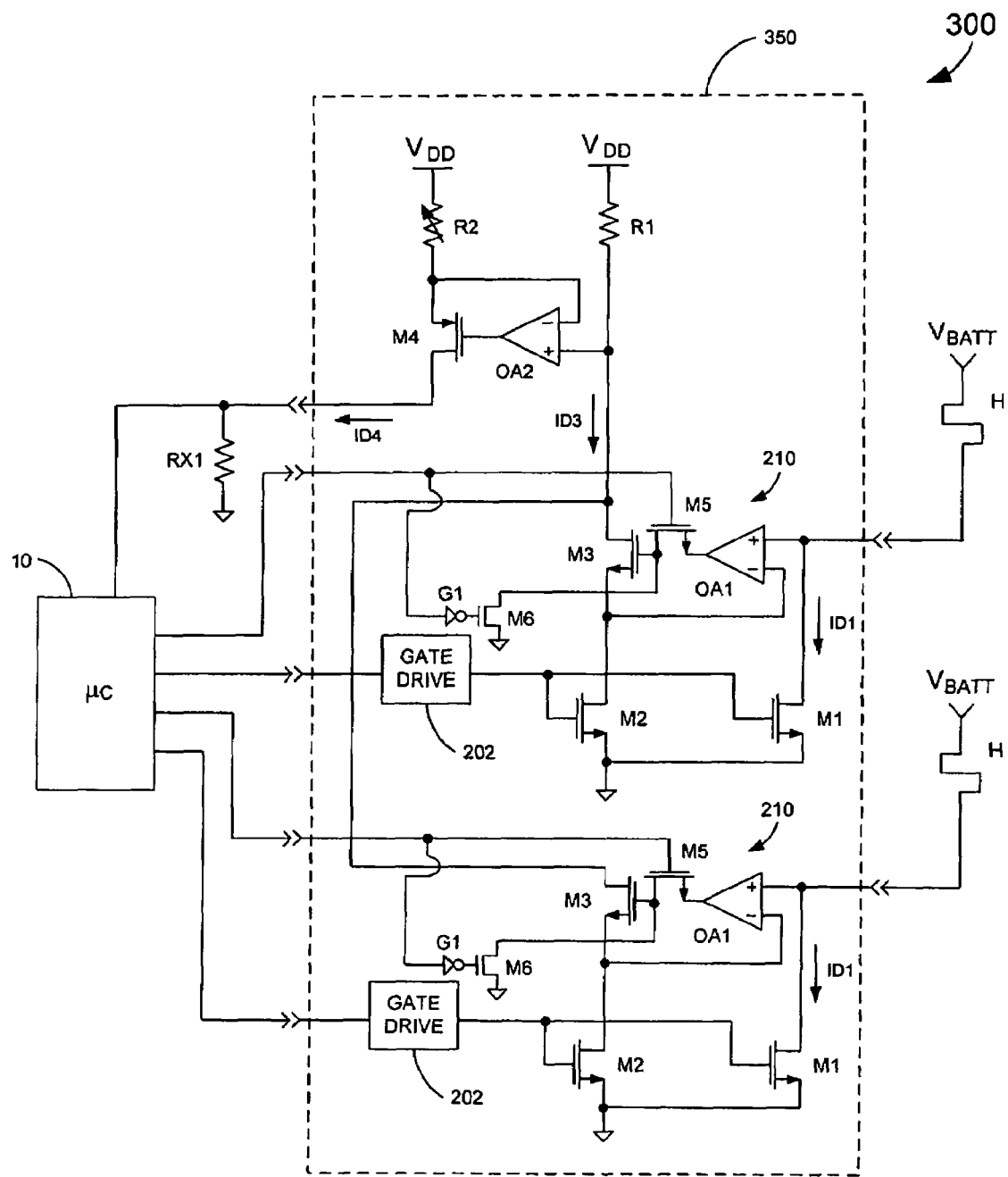
FIG. 3 depicts another integrated driver with improved load current and sense capability for multiple loads.

With reference to FIG. 3, an integrated driver 350 that is capable of sensing the load current of two oxygen sensors is depicted. The integrated driver 350 is similar to the integrated driver 250 of FIG. 2, with the exception that two sense/drive circuits 210 have been integrated within the driver 350. Also, each of the circuits 210 includes a transistor M5 located between a gate of the transistor M3 and an output of the amplifier OA1. The transistor M5, working in conjunction with inverter G1 and transistor M6, allows the microcontroller 10 to dictate which of the load currents are to be measured at a given time.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An integrated driver with improved load current sense capability, comprising:
    a first transistor having a first terminal, a second terminal and a control terminal, wherein the first terminal of the first transistor is coupled to one side of a load;
    a first amplifier including a first input, a second input and an output, wherein the first input of the first amplifier is coupled to the first terminal of the first transistor;
    a second transistor having a first terminal, a second terminal and a control terminal, wherein the control terminal of the second transistor is coupled to the output of the first amplifier, the first terminal of the second transistor is coupled to one side of a power source via a first impedance;
    a third transistor having a first terminal, a second terminal and a control terminal, wherein the first terminal of the third transistor is coupled to the second terminal of the second transistor and the second input of the first amplifier, and wherein the control terminals of the first and third transistors are coupled together and the first and third transistors conduct responsive to a control signal provided on the control terminals of the first and third transistors;
    a second amplifier including a first input, a second input and an output, wherein the first input of the second amplifier is coupled to the first terminal of the second transistor; and
    a fourth transistor including a first terminal, a second terminal and a control terminal, wherein the output of the second amplifier is coupled to the control terminal of the fourth transistor and the second input of the second amplifier is coupled to the second terminal of the fourth transistor, and wherein the second terminal of the fourth transistor is coupled to the one side of the power source via a second impedance and the first terminal of the fourth transistor provides an output current that is indicative of a load current through the load.

2. The driver of claim 1, wherein the load is a heater of an oxygen sensor.

3. The driver of claim 1, wherein an on-impedance of the third transistor is about five-hundred times an on-impedance of the first transistor.

4. The driver of claim 1, wherein the first transistor is a double-diffused metal-oxide semiconductor (DMOS) driver.

5. The driver of claim 4, wherein the DMOS driver has an on-impedance of about fifty milliOhms.

6. The driver of claim 1, wherein the first transistor has an on-impedance of about fifty milliOhms and the third transistor has an on-impedance of about twenty-five Ohms.

7. The driver of claim 1, wherein an impedance of the second impedance is about ten times an impedance of the first impedance.

8. An integrated driver with improved load current sense capability, comprising:
    a first transistor having a first terminal, a second terminal and a control terminal, wherein the first terminal of the first transistor is coupled to one side of a load;
    a first amplifier including a first input, a second input and an output, wherein the first input of the first amplifier is coupled to the first terminal of the first transistor;
    a second transistor having a first terminal, a second terminal and a control terminal, wherein the control terminal of the second transistor is coupled to the output of the first amplifier, the first terminal of the second transistor is coupled to one side of a power source via a first impedance;
    a third transistor having a first terminal, a second terminal and a control terminal, wherein the first terminal of the third transistor is coupled to the second terminal of the second transistor and the second input of the first amplifier, and wherein the control terminals of the first and third transistors are coupled together and the first and third transistors conduct responsive to a control signal provided on the control terminals of the first and third transistors;
    a second amplifier including a first input, a second input and an output, wherein the first input of the second amplifier is coupled to the first terminal of the second transistor; and
    a fourth transistor including a first terminal, a second terminal and a control terminal, wherein the output of the second amplifier is coupled to the control terminal of the fourth transistor and the second input of the second amplifier is coupled to the second terminal of the fourth transistor, and wherein the second terminal of the fourth transistor is coupled to the one side of the power source via a second impedance and the first terminal of the fourth transistor provides an output current that is indicative of a load current through the load, where an on-impedance of the third transistor is about five-hundred times an on-impedance of the first transistor.

9. The driver of claim 8, wherein the load is a heater of an oxygen sensor.

10. The driver of claim 8, wherein the first, second, third and fourth transistors are metal-oxide semiconductor field-effect transistors (MOSFETs).

11. The driver of claim 8, wherein the first transistor has an on-impedance of about fifty milliOhms.

12. The driver of claim 8, wherein the third transistor has an on-impedance of about twenty-five Ohms.

13. The driver of claim 8, wherein an impedance of the second impedance is about ten times an impedance of the first impedance.

14. A method for sensing a load current, comprising the steps of:
    conducting a first current responsive to a load current provided to a load, wherein the first current is proportional to the load current and is less than the load current, and wherein the first current flows through a first impedance;
    providing an output current to an external impedance responsive to the first current, wherein the output current is proportional to the first current and is less than the first current, and wherein the output current flows through a second impedance that is less than the first impedance; and calculating the load current based upon the output current.

15. The method of claim 14, wherein the load is a heater of an oxygen sensor.

16. The method of claim 14, wherein a magnitude of the load current is about five-hundred times a magnitude of the first current.

17. The method of claim 16, wherein the magnitude of the first current is about ten times a magnitude of the output current.

18. The method of claim 14, wherein a magnitude of the load current is about five-thousand times a magnitude of the output current.

19. The method of claim 14, wherein a magnitude of the second impedance is larger than a magnitude of the first impedance.

20. The method of claim 19, wherein the magnitude of the second impedance is about ten times the magnitude of the first impedance.

* * * * *